United States Patent [19]

Nam

[11] Patent Number: 5,653,375
[45] Date of Patent: Aug. 5, 1997

[54] WIRE BONDING APPARATUS

[75] Inventor: Soo-keun Nam, Changwon, Rep. of Korea

[73] Assignee: Samsung Aerospace Industries, Ltd., Kyongsangnam-do, Rep. of Korea

[21] Appl. No.: 547,731

[22] Filed: Oct. 26, 1995

[30] Foreign Application Priority Data

Oct. 29, 1994 [KR] Rep. of Korea ............ 94-28104
Nov. 25, 1994 [KR] Rep. of Korea ............ 94-31234

[51] Int. Cl.⁶ .................................. H01L 21/60
[52] U.S. Cl. ................... 228/4.5; 228/12; 228/103
[58] Field of Search ................. 228/4.5, 9, 12, 228/103

[56] References Cited

U.S. PATENT DOCUMENTS

3,894,672  7/1975  Arai et al. ............... 228/4.5
4,119,259  10/1978  Sakamoto ............... 228/4.5
4,856,699  8/1989  Schoepe et al. ............... 228/4.5

Primary Examiner—Kenneth J. Ramsey
Attorney, Agent, or Firm—Finnegan, Henderson, Farabow, Garrett & Dunner, L.L.P.

[57] ABSTRACT

A wire bonding apparatus includes a frame, an X, Y, table, installed on the frame, including a linear stepping motor with a first stator and a first inductor, a transducer, pivotably installed on the X, Y table, to one end of which a capillary for bonding wire is installed, a first transferring portion installed to the frame to make the other end of the transducer ascend so that the capillary for wire bonding ascends, a second transferring portion installed on the X, Y table in front of the first transferring portion to, thereby, make the other end of the transducer ascend during bonding, and a first location detecting portion installed to the frame and the X, Y table to detect an amount of movement in the X and Y directions so that energy loss according to the driving of a head portion can be reduced.

13 Claims, 10 Drawing Sheets

WIRE BONDING APPARATUS

BACKGROUND OF THE INVENTION

1. Field of the Invention

The present invention relates to a wire bonding apparatus, and more particularly, to a wire bonding apparatus with an improved bonding head.

2. Description of Related Art

Generally, a wire-bonding process for bonding a chip to a lead frame with a plurality of formed leads, and then connecting the chip to leads with wire (generally, gold wire) of very small diameter, is realized by a bonding head which is the core portion of a wire bonding apparatus.

There are several kinds of bonding heads for such wire bonding apparatus depending on the driving method. A bonding head (name of model is UTC-100) manufactured by Shinkawa of Japan uses an X, Y table to which a ball screw and a linear motor guide are attached for transferring a transducer in the X and Y directions, and a motor and a cam for transferring it in the Z direction.

And, in another example of a bonding head, an X, Y table is used for transferring a transducer in the X and Y directions, and a linear motor is used for transferring it in the Z direction.

A wire bonding apparatus using a conventional bonding head, as described above, has the following problems.

First, the ball screw or the linear motor used for transferring the transducer in the X, Y and Z directions, causes energy loss by friction and abrasion of components, and thereby requires a periodic replacement of the components.

Second, the structure of the bonding head is very complicated, and thereby requires many assembling operation processes making it difficult to improve productivity.

Third, in order to achieve high speed wire bonding, an AC or DC servo motor and a driving apparatus need to be attached to the X, Y table which raises production costs due to increased equipment cost.

Fourth, the X, Y table is heavy and therefore requires a large installation space.

SUMMARY OF THE INVENTION

Accordingly, the present invention is directed to a wire bonding apparatus that substantially obviates one or more of the problems due to limitations and disadvantages of the related art.

The present invention provides a wire bonding apparatus with a simple structure that is capable of reducing energy loss due to friction in the driving portion. Additionally, the bonding head of the present invention enables compact design and precise control of its position according to the movement of the X, Y table.

Additional features and advantages of the invention will be set forth in the description which follows, and in part will be apparent from the description, or may be learned by practice of the invention. The objectives and other advantages of the invention will be realized and attained by the apparatus particularly pointed out in the written description and claims hereof as well as the appended drawings.

To achieve these and other advantages and in accordance with the purpose of the invention, as embodied and broadly described, the invention provides a wire bonding apparatus including a frame; an X, Y table installed on the frame including a linear stepping motor with a first stator and a first inductor; a transducer pivotably installed on the X, Y table and to one end of which a capillary for bonding wire is installed; first transferring means, installed to the frame to make the other end of the transducer transfer so that the capillary for bonding wire transfers; second transferring means, installed on the X, Y table in front of the first transferring means to thereby make the other end of the transducer transfer at the time of bonding; and a first location detecting portion installed to the frame and the X, Y table to detect the amount of movement in the X and Y directions.

In the present invention, the first transferring means includes a linear stepping motor having a second stator perpendicularly installed on the frame and a second inductor slid in a vertical direction along the second stator, a spring for connecting a support installed to one end of the second inductor to the other end of the transducer and a stopper installed to the second stator to make contact with the upper surface of the other end of the transducer.

Furthermore, the first location detecting means includes an X direction detecting portion for detecting the distance of the first inductor transferred in the X direction and a Y direction detecting portion for detecting the distance of the first inductor transferred in the Y direction.

The X direction detecting portion includes: an encoding glass, installed to the first inductor of the X, Y table, having a predetermined first reflecting layer pattern for reflecting light; a case installed to the frame, incorporating a light source for irradiating light to the encoding glass and a light receiving portion for receiving light irradiated from the light source and reflected by the first reflecting layer pattern, and a photo glass installed on the upper surface of the case incorporating the light source and the light receiving portion, having a second reflection layer pattern for passing through the light reflected by the encoding glass toward the light receiving portion or reflecting the light to the encoding glass.

Additionally, the first transferring means further includes a second location detecting means for detecting the transferred location of the second inductor.

It is to be understood that both the foregoing general description and the following detailed description are exemplary and explanatory and are intended to provide further explanation of the invention as claimed.

The accompanying drawings are included to provide a further understanding of the invention and are incorporated in and constitute a part of this specification, illustrate one embodiment of the invention and together with the description serve to explain the principles of the invention.

BRIEF DESCRIPTION OF THE DRAWINGS

The accompanying drawings, which are incorporated in and constitute a part of this specification, illustrate embodiments of the invention and, together with the description, serve to explain the objects, advantages, and principles of the invention. In the drawings.

DETAILED DESCRIPTION OF THE PREFERRED EMBODIMENT

A wire bonding apparatus according to the present invention is provided with a heater block and a bonding head for wire-bonding a lead frame mounted to the heater block.

Reference will now be made in detail to the present preferred embodiment of the invention, an example of which is illustrated in the accompanying drawings.

Figure 1:
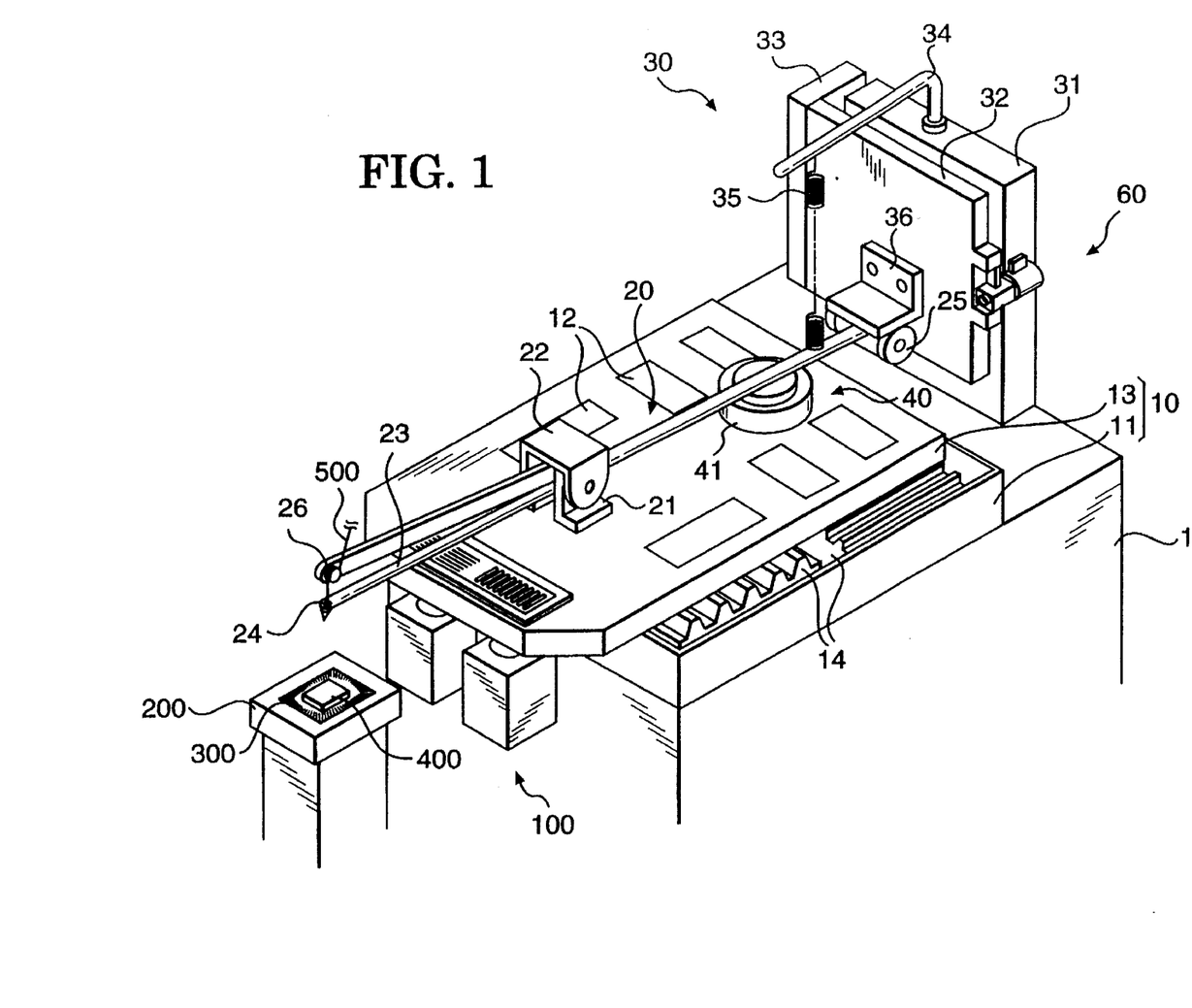
FIG. 1 is a perspective view of a wire bonding apparatus according to one embodiment of the present invention.

The exemplary embodiment of the wire bonding apparatus of the present invention is shown in FIG. 1.

As embodied herein and referring to FIG. 1 the wire bonding apparatus includes a frame 1, an X, Y table 10, installed on frame 1, having a linear stepping motor, a head portion 20 pivotably installed on X, Y table to bond wire, a first transferring portion 30 installed adjacent to an end of a transducer 23 of head portion 20 to transfer transducer 23, a second transferring portion 40 installed on X, Y table 10 in front of first transferring portion 30 to transfer the other end of transducer 23 of the head portion, a first location detecting portion 100 installed to frame 1 and the X, Y table 10 to detect the movement amount in the X and Y directions and a second location detecting portion 60 installed to first transferring portion 30 to detect the transferred location.

X, Y table 10 is fixedly installed or mounted to frame 1 and includes a conventional linear stepping motor. X, Y table 10 comprised of a linear stepping motor includes a first stator 11 installed to frame 1 and a first inductor 13 installed on first stator 11 so as to be transferred along the X-axis and Y-axis by a permanent magnet 12, an air bearing and an electromagnet (not shown). Here, multiple arrays of teeth 14 are formed along the X-axis and Y-axis on the surface of first stator 11 facing first inductor 13.

Head portion 20, installed to first inductor 13 of X, Y table 10 so that both ends of head portion 20 can pivot to bond a lead frame terminal to wires of a chip, includes a bracket 21 fixed to first inductor 13 and a supporting member 22 fixed to one portion between both ends of transducer 23 and hinge-coupled to bracket 21 to pivotably support transducer 23 relative to bracket 21. A capillary 24 for bonding wire 500 is installed to one end of transducer 23 and a roller 25, rotatably installed relative to the transducer, is installed to the other end of transducer 23. Also, a wire clamp 26, supported by supporting member 22, is installed above transducer 23.

First transferring portion 30 is installed to frame 1 perpendicular to X, Y table 10 to pivot transducer 23 of head portion 20, hinge-coupled to bracket 21, and includes a conventional linear stepping motor. First transferring portion 30 comprised of the linear stepping motor includes a second stator 31 fixedly installed perpendicular to frame 1, a second inductor 32 installed transferrably along the Z-axis by a permanent magnet, an air bearing and an electromagnet, to second stator 31 and a guide member 33 for preventing the rotation of second inductor 32 when second inductor 32 transfers relative to second stator 31; and further includes a support 34 installed on second stator 31, a spring 35 for connecting an end of support 34 to one end of transducer 23 to which roller 25 is installed, and a stopper 36 installed protrudently by a predetermined length to the front surface of second inductor 32 to contact the upper surface of roller 25. Here, guide member 33 is fixed to second inductor 32 and is comprised of a plate-shaped permanent magnet slidably contacting the side surface of second stator 31.

Second transferring portion 40 is installed between the other end of the transducer 23 and the first inductor of the X, Y table and is comprised of a conventional voice coil motor 41 to rotatably move transducer 23.

Figure 2:
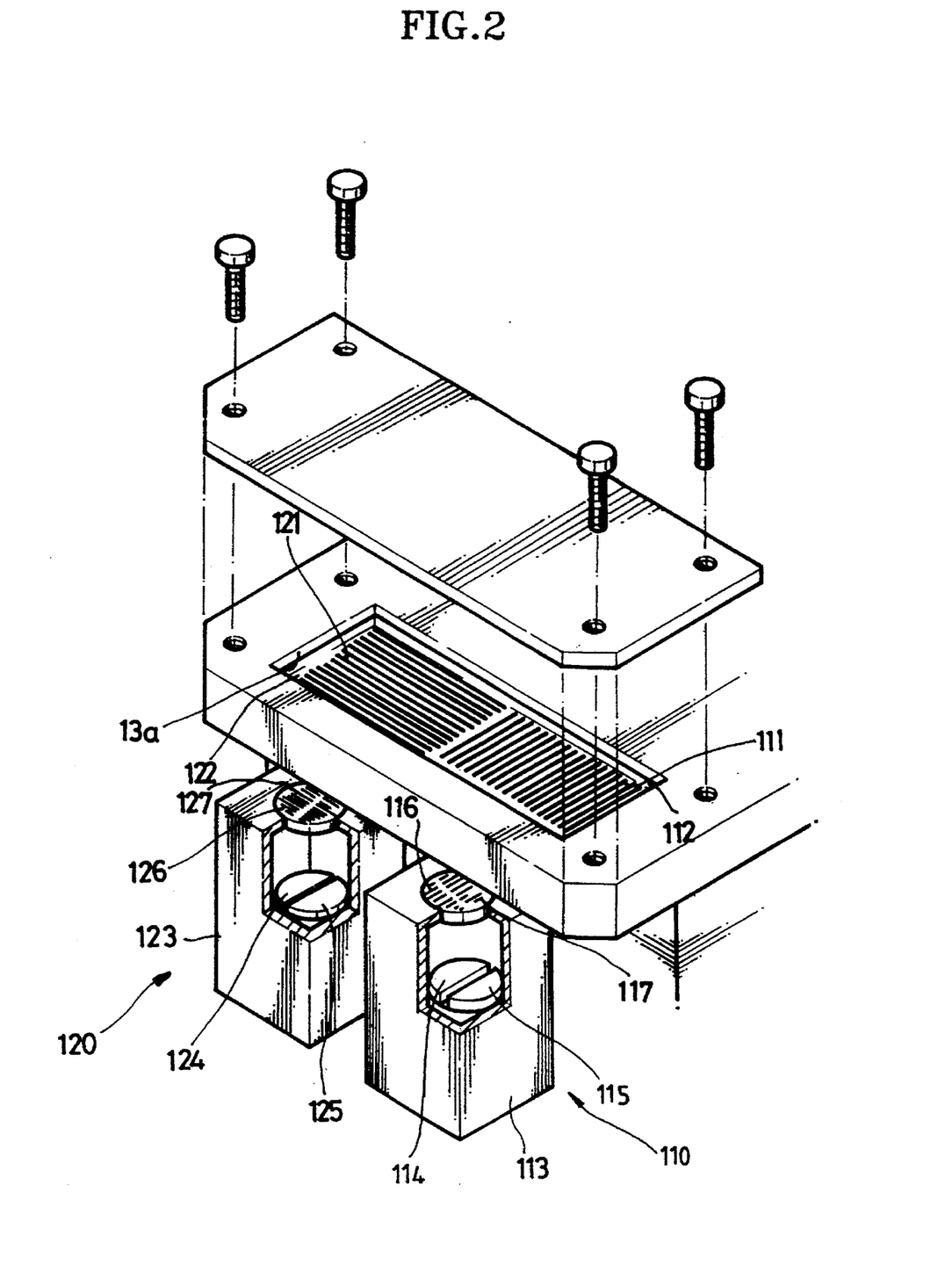
FIG. 2 is an exploded perspective view of a first location detecting portion.

Referring to FIG. 2, first location detecting portion 100 is installed to frame 1 and first inductor 13 of X, Y table 10 and includes an X direction detecting portion 110 for detecting the transferred distance of first inductor 13 to which head portion 20 (See FIG. 1) is installed along the X-axis and a Y direction detecting portion 120 for detecting the transferred distance thereof along the Y-axis.

X direction detecting portion 110 is constructed as follows:

An encoding glass 112 with a predetermined first reflecting layer pattern 111 for reflecting light is installed to inductor 13 of X, Y table 10. A light source 114 for irradiating light to encoding glass 112 and a light receiving portion 115 for detecting the amount of light irradiated from light source 114 and reflected by first reflecting layer pattern 111 are installed inside a case 113 fixed to frame 1 so as to be located perpendicular to encoding glass 112. A photo-glass 117, which has a second reflecting layer pattern 116 for passing light reflected by encoding glass 112 to light receiving portion 115 or reflecting the above light again to encoding glass 112, is installed on case 113 facing light source 114 and light receiving portion 115. A supporting hole 13a for supporting encoding glass 112 is formed in first inductor 13 and encoding glass 112 is fixed inside support hole 13a to avoid being subject to outside interference.

Figure 3:
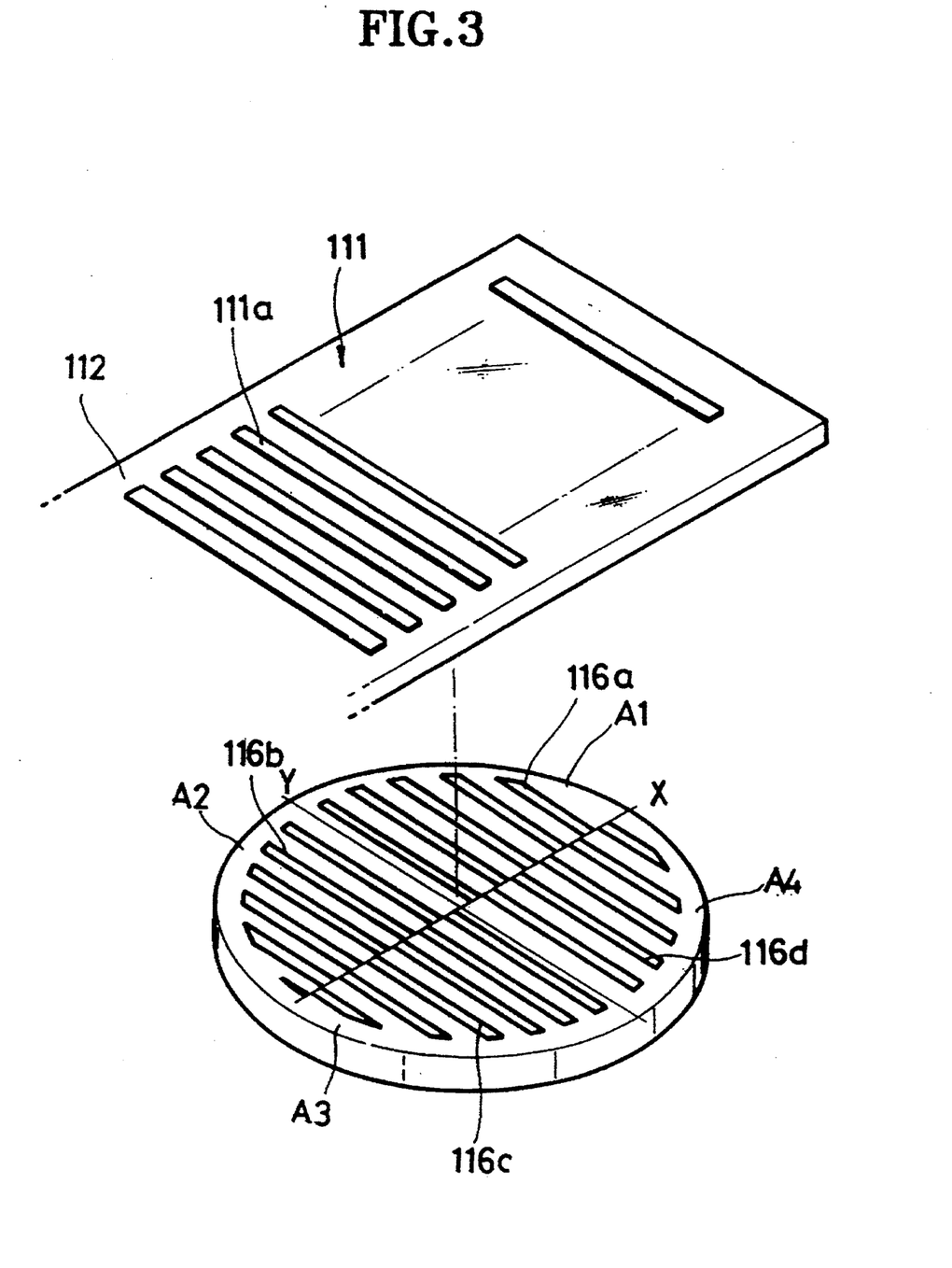
FIG. 3 is a perspective view of an encoding glass and a photo-glass of an X direction detecting portion of the first location detecting portion and shows a first reflecting layer pattern and a second reflecting layer pattern.

As shown in FIG. 3, first reflecting layer pattern 111 formed on encoding glass 112 is realized by forming a first reflecting layer 111a into parallel strips arranged in the Y direction, having a predetermined pitch on transparent encoding glass 112. Also, as shown in FIG. 3, second reflecting layer pattern 116 formed on photo-glass 117 is realized by forming second reflecting layers 116a, 116b, 116c and 116d in the shape of stripes arranged in the Y direction with a predetermined pitch on first, second, third and fourth quadrants A1, A2, A3 and A4 of photo-glass 117, respectively. Here, second reflecting layers 116a, 116b, 116c and 116d respectively formed on first, second, third and fourth quadrants A1, A2, A3, and A4, are staggered by a predetermined pitch on the basis of the Y-axis on the photo-glass.

Y direction detecting portion 120 is constructed as follows:

An encoding glass 122 with a predetermined third reflecting layer pattern 121 for reflecting light is installed on inductor 13 of X, Y table 10 as shown in FIGS. 1 and 2. A light source 124 for irradiating light to encoding glass 122 and a light receiving portion 125 for detecting the amount of light irradiated from light source 124 and reflected by third reflecting layer pattern 121 are installed inside a case 123 supported by the frame so as to be located perpendicular to encoding glass 122. And, a photo-glass 127 with a fourth reflecting layer pattern 126 for passing light reflected by encoding glass 122 to light receiving portion 125 or reflecting the above light again to encoding glass 122, is installed on case 123 facing light source 124 and light receiving portion 125.

Figure 4:
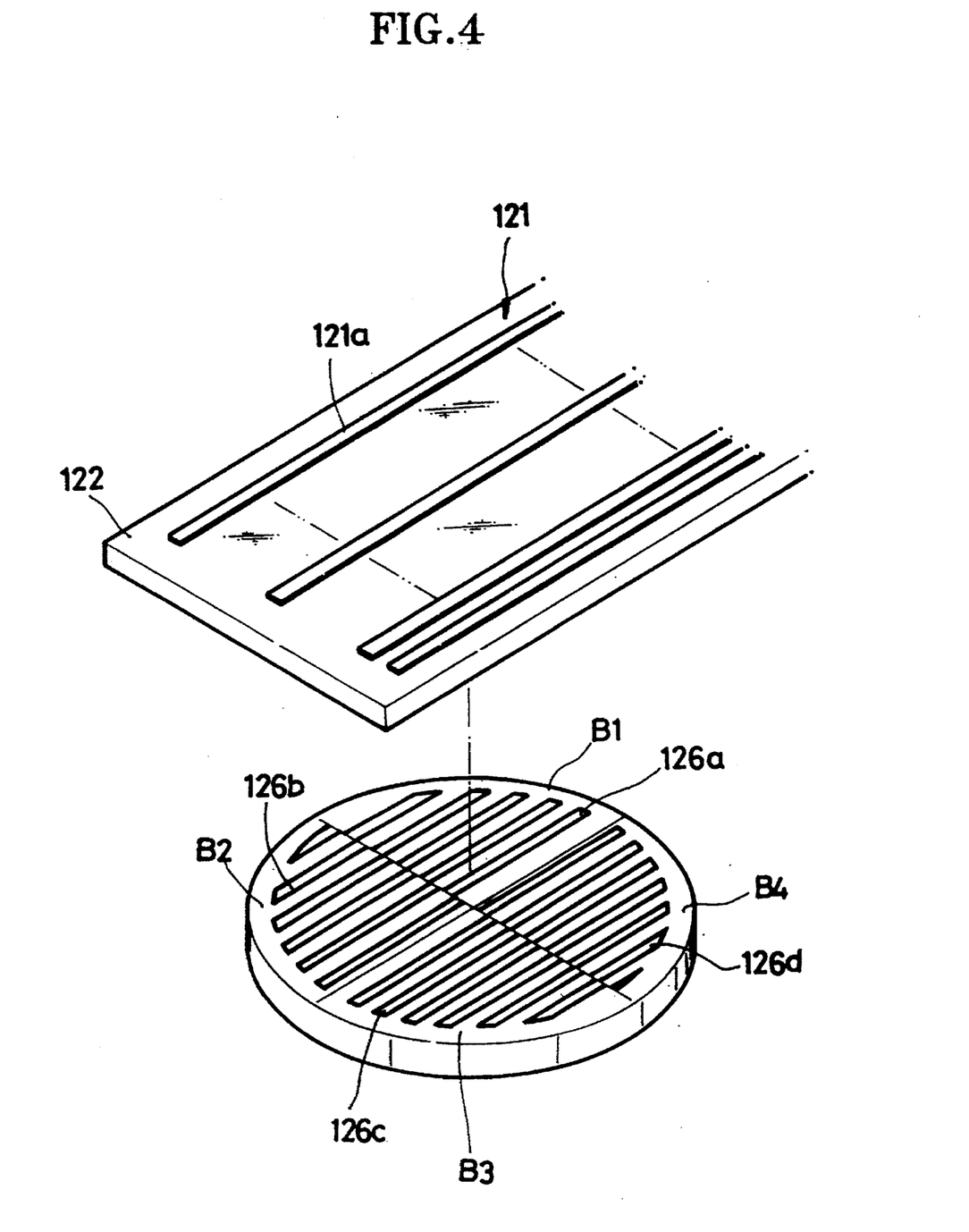
FIG. 4 is a perspective view of an encoding glass and a photo-glass of a Y direction detecting portion of the first location detecting portion and shows a third reflecting layer pattern and a fourth reflecting layer pattern.

As shown in FIG. 4, third reflecting layer pattern 121 formed on encoding glass 122 is realized by forming third reflecting layer 121a into parallel strips arranged in the X direction with a predetermined pitch on transparent encoding glass 122. And, fourth reflecting layer pattern 126 formed on photo-glass 127 is realized by forming fourth reflecting layers 126a, 126b, 126c and 126d in the shape of stripes arranged in the X direction with a predetermined pitch on first, second, third and fourth quadrants B1, B2, B3 and B4 of photo-glass 127, respectively. Here, fourth reflecting layers 126a, 126b, 126c and 126d respectively formed on first, second, third and fourth quadrants B1, B2, B3 and B4 are staggered by a predetermined pitch on the basis of the X-axis on the photo-glass.

Figure 5:
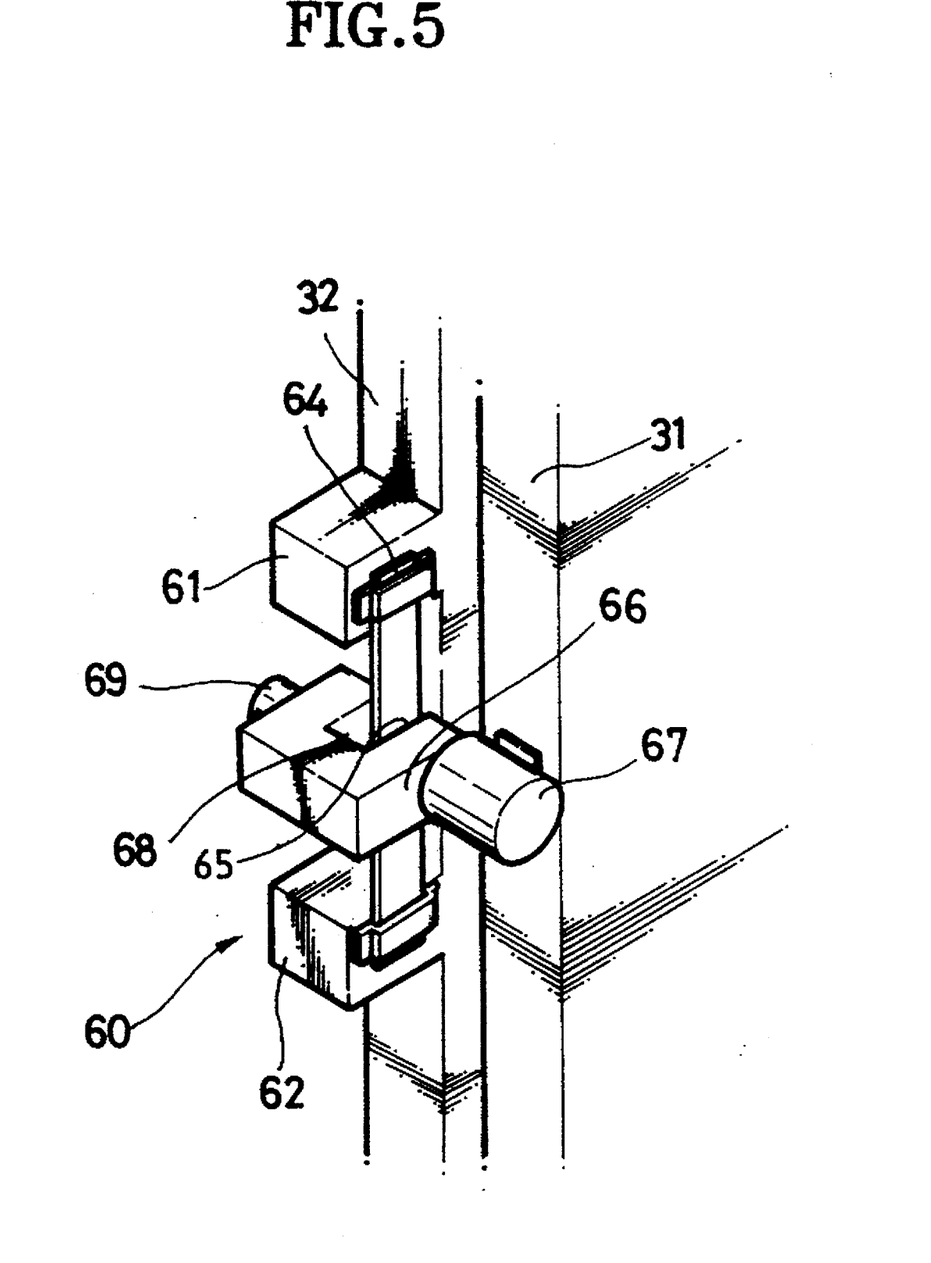
FIG. 5 is a perspective view of a second location detecting portion.

Referring to FIG. 5, second location detecting portion 60 detects the transferred distance of second inductor 32 relative to second stator 31 in the Z axis direction. Second location detecting portion 60 includes an encoding glass 64 installed to a pair of supporting protuberances 61 and 62 protruding from a side surface of second stator 31 and equally spaced, from a bracket 66 fixed to second stator 31 by a predetermined distance. A predetermined third reflecting layer pattern is formed to bracket 66 in which groove 65 is formed, into which the encoding glass is inserted. A light source 67 is installed so as to face one side surface of encoding glass 64 to thereby irradiate light; and a photo-glass 68 and a light receiving portion 69 are sequentially installed to bracket 66 facing the other side surface of encoding glass 64. Here, the reflecting pattern formed on photo-glass 68 and encoding glass 64 has the same pattern as that described in the first location detecting portion 100.

The operation of the wire bonding apparatus of the present invention constructed as fully described above will be explained in connection with FIGS. 6 through 14.

Figure 6:
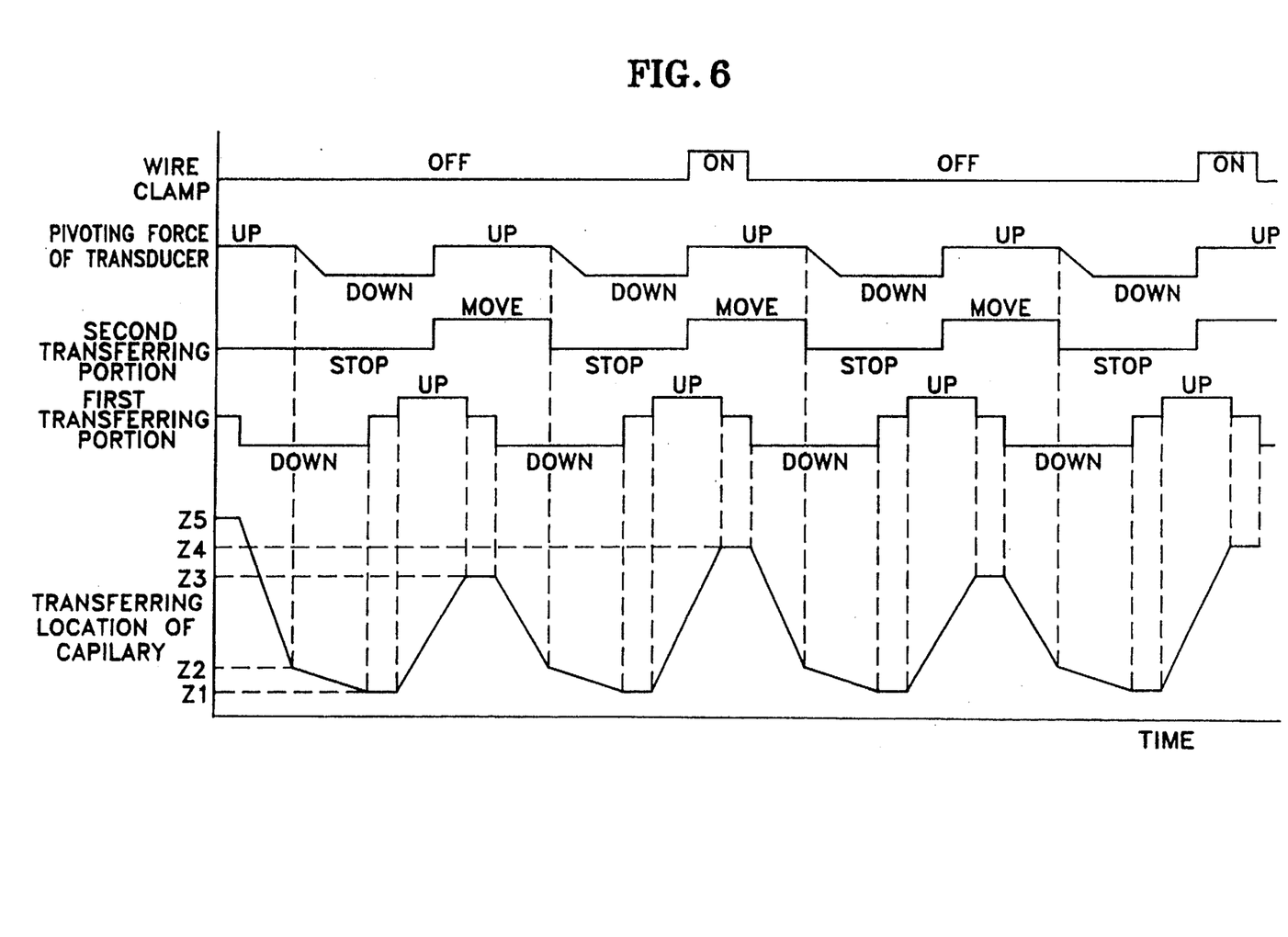
FIG. 6 is a diagram for illustrating a bonding cycle of the wire bonding apparatus according to the present invention.
Figure 7:
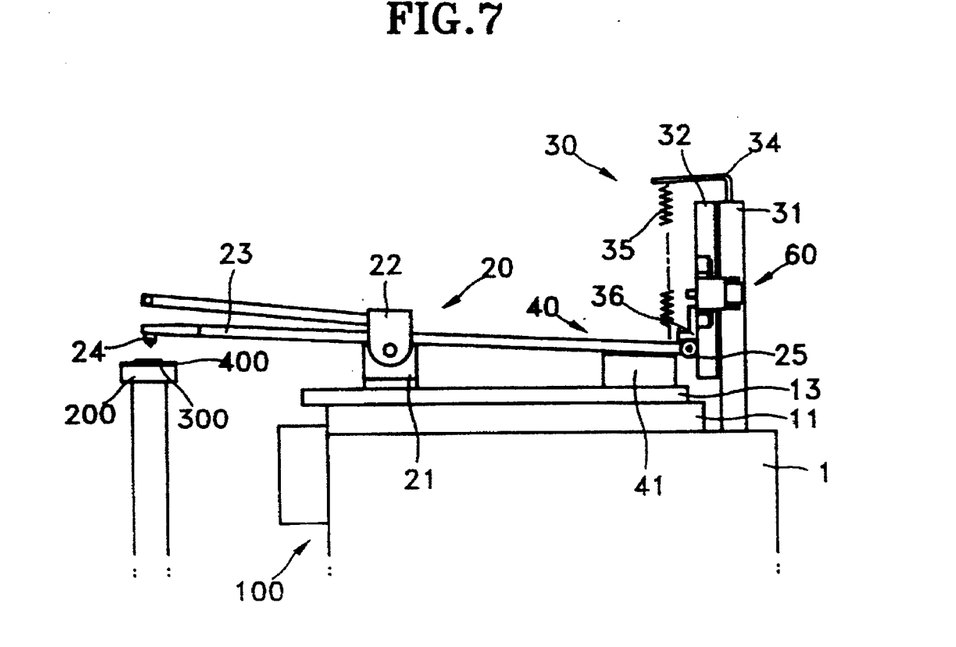
FIGS. 7 through 14 show the operation states of the wire bonding apparatus according to the present invention.

FIG. 6 shows a bonding cycle diagram according to the operation of the wire bonding apparatus of the present invention; and FIGS. 7 through 14 show sequentially the operational states of the wire bonding apparatus of the present invention.

The state of bonding the chip to the leads will be explained with reference to the bonding cycle diagram and the operational state views where a lead frame 300 and a chip 400 are supplied to a heater block 200, located vertically under capillary 24, which is installed at the end of transducer 23 of head portion 20.

First of all, the state of the bonding port of chip 400 to the wire is as follows. While a pivoting force acts on transducer 23, which is hinge-connected to bracket 21 by spring 35 of first transferring portion 30, stopper 36 installed to second inductor 32 of first transferring portion 30, makes contact with roller 25 installed to an end of transducer 23, to thereby prevent the ascension of the other end of transducer 23 and thus maintain the state shown in FIG. 7. The location of capillary 24, installed to one end of transducer 23 in the Z direction, is position Z5 shown in FIG. 6.

Figure 8:
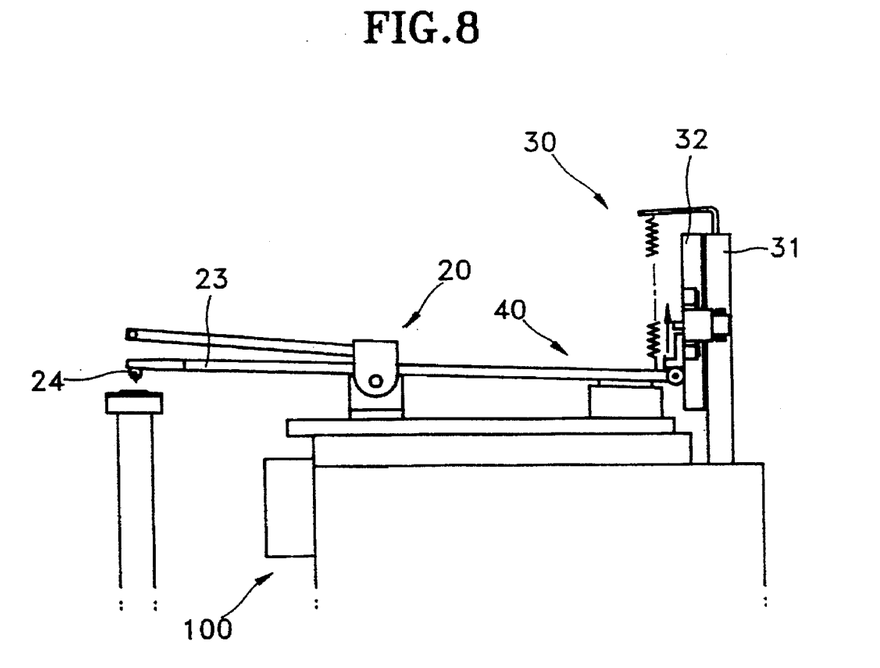

In this state, with the ascension of second inductor 32 relative to second stator 31 by the operation of first transferring portion 30, stopper 36 ascends, as transducer 23, which pivoted by the tension of spring 35 and capillary 24 installed to one end of transducer 23, descends to a state as shown in FIG. 8 and the location of capillary 24 is position Z4. The Z4 position of capillary 24 is the initial location or setting for bonding.

In the process of realizing the above operation, first inductor 13 of X, Y table 10, installed on frame 1, namely, X, Y table 10 comprised of the linear stepping motor, is transferred in the X-axis direction, the Y-axis direction, or the X- and Y-axis directions with respect to first stator 11 to thereby locate capillary 24 installed to one end of transducer 23 above the chip port bonded to the lead port of the lead frame.

Figure 9:
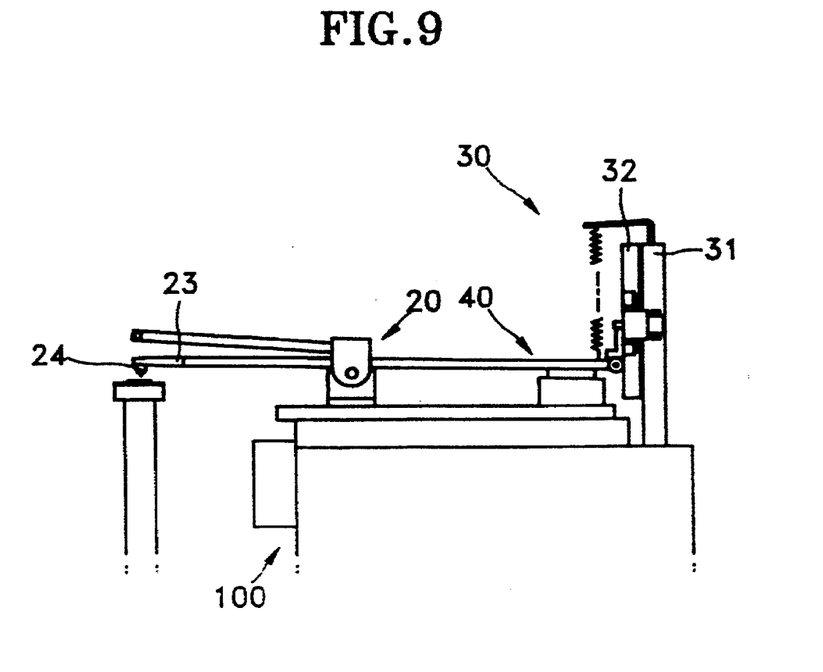

In the above state, if first transferring portion 30 operates to further raise second inductor 32, capillary 24 descends to a position Z2 by the above operation, and the distance between the chip and the end tip of the capillary ranges from 150 to 200 μm and the capillary moves at a high speed, about 250 mm/sec, to a state as shown in FIG. 9.

Figure 10:
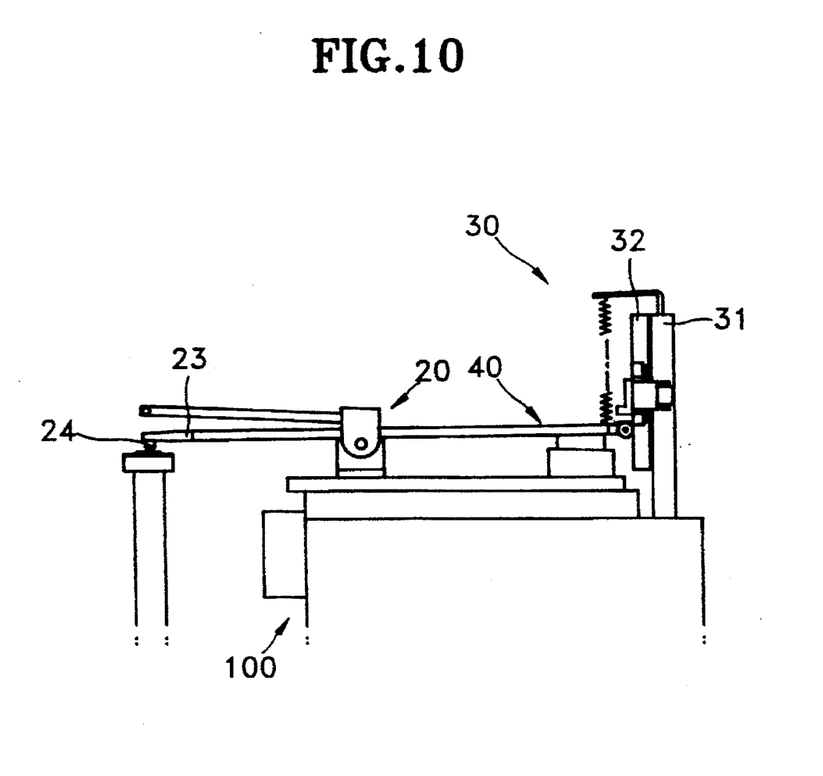

In this state, current is supplied to voice coil motor 41 for providing pressurized force for bonding to thereby change the descending speed of capillary 24 to be slower than the ascending speed of second inductor 32. Accordingly, stopper 36 of second inductor 32 is separated from roller 25 of transducer 23, and voice coil motor 41 continuously operates to make one end of transducer 23 to which roller 25 is installed, to ascend, thereby resulting in capillary 24 contacting chip 400 as shown in FIG. 10. In this state, transducer 23 is rotated by voice coil motor 41 and, thus, force for bonding is applied to capillary 24 for a predetermined length of time to bond the wire. Furthermore, when the bonding of the port of chip 400 is completed, the current applied to the voice coil is interrupted.

Figure 11:
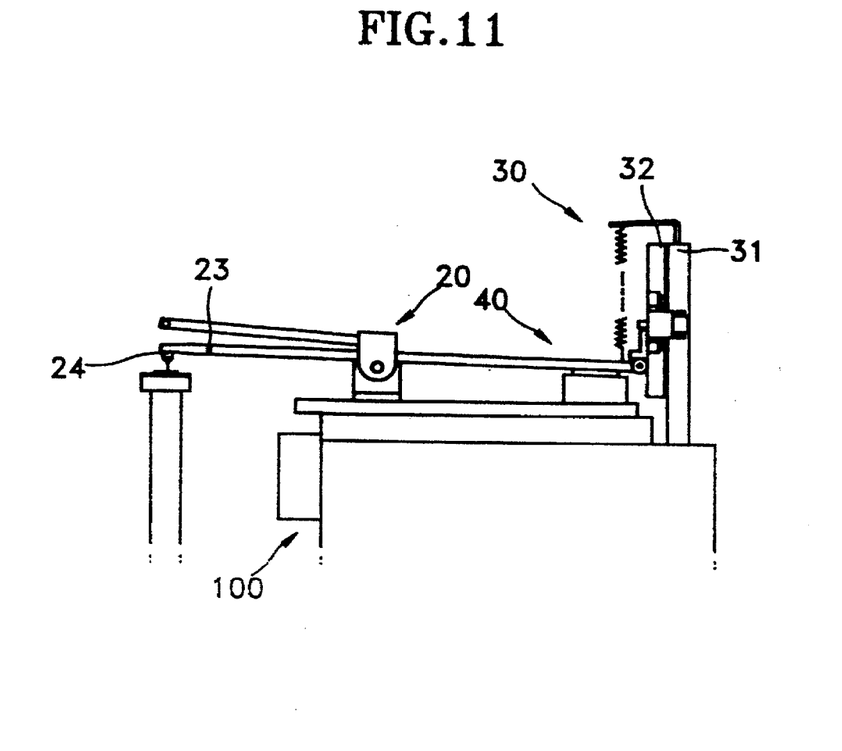

When the bonding of the chip port is completed, second inductor 32 of first transferring portion 30 descends at high speed to thereby make roller 25 contact stopper 36, installed to one end of transducer 23, and descends as shown in FIG. 11. Thus, capillary 24 ascends at a high speed so that the distance from the chip becomes Z3.

When the bonding to the chip port is completed, first inductor 13 of the linear stepping motor, included in X, Y table 10 installed on frame 1, moves in the X-axis direction, the Y-axis direction or the X- and Y-axis directions to locate capillary 24 on the lead port of the lead frame for connecting to the chip port.

At this time, the transferred amount of first inductor 13 relative to first stator 11 is detected by first location detecting portion 100 to precisely locate capillary 24 located at one end of transducer 23 installed on first inductor 13 on the lead frame, to bond.

The detection of the transferred distance of first inductor 13 by the first detecting portion 100 is performed by X direction detecting portion 110 and Y direction detecting portion 120. The detection of the transferred distance of first inductor 13 by X direction detecting portion 110 will be explained in connection with FIGS. 2,3 and 4 as follows.

Light source 114 is turned on to irradiate light to photo-glass 117, on which second reflecting layer pattern 116 is formed, and encoding glass 112, on which first reflecting layer pattern 111 is formed, which causes light irradiated from light source to be irradiated to first reflecting layer pattern 111, through second reflecting layer pattern 116, and then makes the irradiated light reflected by first reflecting layer 111a, forming first reflecting layer pattern 111 so that the reflected light passes between second reflecting layers 116a-116d of second reflecting layer pattern 116 to be received by light receiving portion 115. In this state, first inductor 13 is transferred and thus encoding glass 112 is transferred. Accordingly, mutually superimposed portions are generated in first and second reflecting layers 111a and 116a-116d to make the amount of light detected by light receiving portion 115 differ. Namely, first reflecting layers 111a of first reflecting layer pattern 111 have a predetermined pitch therebetween and are formed to have the shape of stripes arranged in the Y direction.

Moreover, second reflecting layer pattern 116 formed on photo-glass 117 has a predetermined pitch on the first, second, third and fourth quadrants of the photo-glass, respectively, and is comprised of second reflecting layers 116a, 116b, 116c and 116d arranged in strips. Second reflecting layer pattern 116a, 116b, 116c and 116d formed on the first, second, third and fourth quadrants, respectively, are staggered by a predetermined pitch on the basis of the Y-axis on photo-glass 117. Accordingly, if encoding glass 112, installed to first inductor 13, is transferred, first reflecting layer pattern 111 and second reflecting layer pattern 116 are partially superimposed to generate light interference; and thus, the light reflected by first reflecting layer pattern 111 is received by light receiving portion 115 through second reflecting layer pattern 116 formed on the first, second, third and fourth quadrants and, at this time, the amount of received light differs. The amount of the light detected by light receiving portion 115 is converted into distance and, thus, the transferred distance of first inductor 13 in the X-axis direction can be calculated precisely.

The Y direction detecting portion of the first location detecting portion converts the amount of light detected by a light receiving portion 125 due to interference of third and fourth reflecting layer patterns 121 and 126 formed in the X direction into the transferred distance of first inductor 13 in the Y direction with the method as fully described above.

Figure 12:
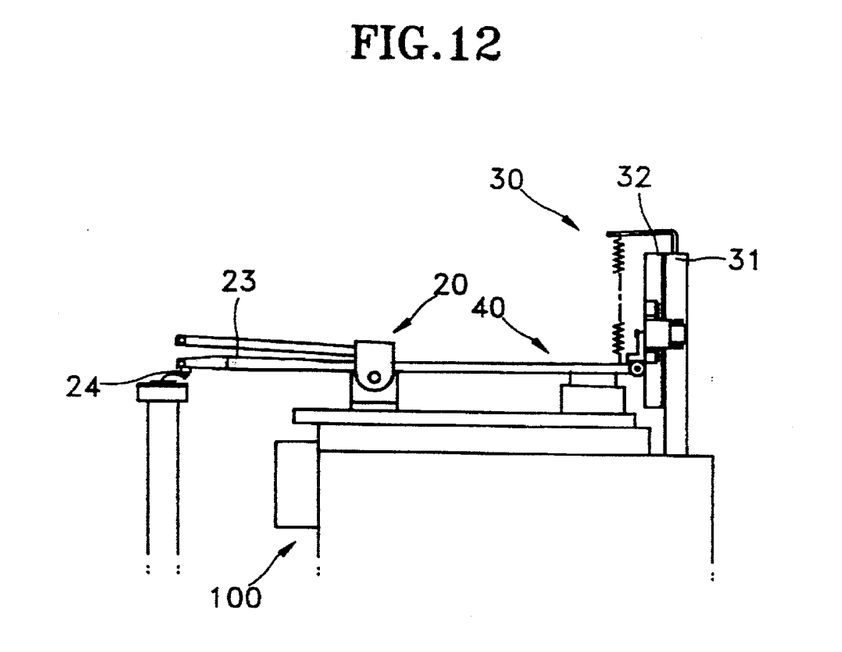
Figure 13:
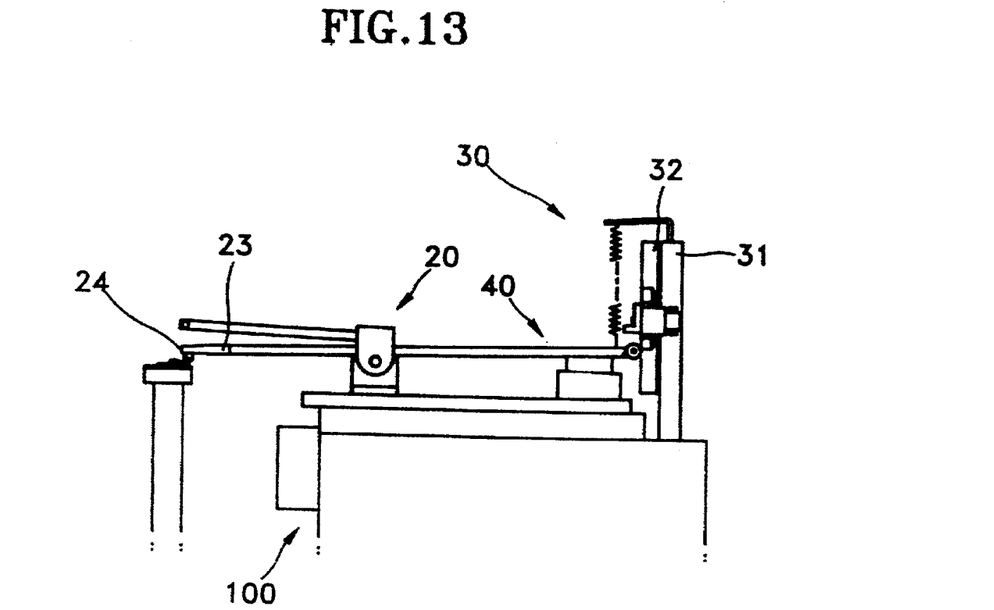

As fully described above, if the transferred location of the X, Y table 10 is controlled by calculating the transferred distance of first inductor 13 by first location detecting portion 100 so that capillary 24 is located precisely above the lead port of the lead frame, second inductor 32 of first transferring portion 30 ascends to make capillary 24 descend so that the height of capillary 24 becomes Z3 as shown in FIGS. 6 and 12. If the location of capillary 24 is Z3, the ascension of second inductor 32 is terminated and second transferred portion 40 supplies current to voice coil motor 41 to slow the descending speed of capillary 24. Then, second inductor 32 ascends at a high speed so that stopper 36 separates from one end of transducer 23 and capillary 24 descends by voice coil motor 41 only and contacts the lead port as shown in FIG. 13 to bond the wire. In this state, the current is supplied to the voice coil motor for a predetermined period to apply force for bonding to the transducer.

Figure 14:
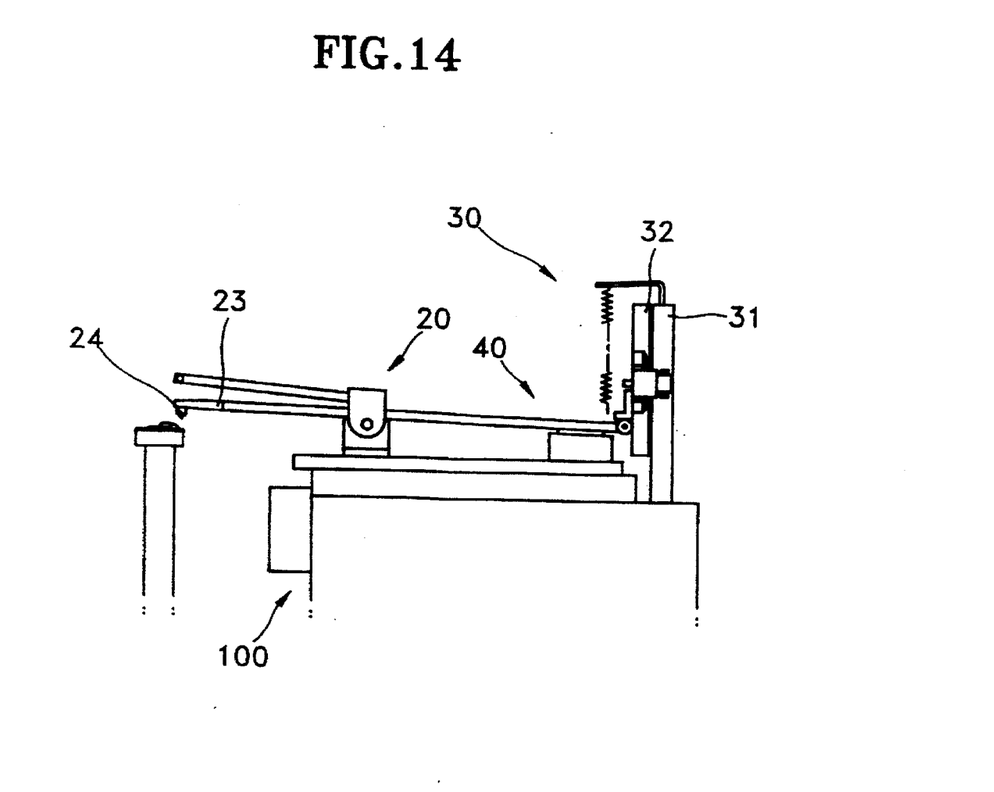

When the bonding completes, the supply of current to the voice coil motor 41 is terminated, wire 500 is grabbed by wire clamp 26, and second inductor 32 descends as shown in FIG. 14 to make stopper 36 contact roller 25. Then, stopper 36 continuously descends to make capillary 24 ascend with wire 500 supported so that the wire is cut. When the height of the capillary reaches a distance of Z4, as shown in FIG. 6, the ascent of the capillary is terminated. The X, Y table operates to transfer the capillary to its initial location so that a continuous bonding operation is executed with the method as fully described above.

As fully described above, the wire bonding apparatus of the present invention can considerably reduce energy loss due to friction, because of the small amount of friction in the driving portion of the first transferring portion and the X, Y table for transferring the capillary. Additionally, the simple structure of the present invention simplifies the maintenance of the wire bonding apparatus.

Also, in addition to the bonding apparatus, the present invention can be widely applied to high speed precision control equipment and various kinds of semiconductor fabrication apparatus.

What is claimed is:

1. A wire bonding apparatus, comprising:

a frame;

an X, Y table installed on said frame, said table including a linear stepping motor having a stator and inductor movable relative to one another in an X and Y direction;

a transducer pivotablly installed on said X, Y table, said transducer including a capillary, installed adjacent one end thereof for supporting bonding wire;

first transferring means, installed on said frame adjacent another end of the transducer opposite said one end, for transferring said capillary;

second transferring means, installed on said X, Y table and spaced from the first transferring means toward said one end of the transducer, for causing said one end of said transducer to transfer said capillary at the time of bonding; and a location detecting device installed to said frame and said X, Y table to detect the amount of movement of the X, Y table in the X and Y directions.

2. A wire bonding apparatus according to claim 1, wherein said first transferring means comprises a second linear stepping motor having a second stator installed perpendicular to the first stator on said frame and a second inductor slidably mounted to move in a vertical direction along said second stator, a spring connecting a support, installed to one end of said second inductor, to the other end of the transducer; a stopper installed to said second inductor, for contacting the other end of said transducer to limit the pivotal movement of the transducer.

3. A wire bonding apparatus according to claim 1, wherein said second transferring means is a voice coil motor installed between said inductor of said X, Y table and the other end of said transducer.

4. A wire bonding apparatus according to claim 2, the other end of the transducer includes a roller having an outer circumferential surface to engage said stopper.

5. A wire bonding apparatus according to claim 1, wherein said means for detecting location comprises:

an X direction detecting portion for detecting the transferred distance of said inductor in the X direction; and a Y direction detecting portion for detecting the transferred distance of said inductor in the Y direction.

6. A wire bonding apparatus according to claim 5, wherein said X direction detecting portion comprises:

an encoding glass, installed to the inductor of said X, Y table, having a predetermined first reflecting layer pattern for reflecting light;

a case, installed to said frame, incorporating a light source for irradiating light to said encoding glass and a light receiving portion for receiving light irradiated from said light source and reflected by said first reflecting layer pattern; and a photo-glass, installed on said case, incorporating said light source and said light receiving portion, having a second reflection layer pattern for passing light reflected by said encoding glass through said light receiving portion or reflecting said light to said encoding glass.

7. A wire bonding apparatus according to claim 6, wherein said first reflecting layer pattern formed on said encoding glass is comprised of the first reflecting layer of strips arranged to have a predetermined pitch in the Y direction on the encoding glass.

8. A wire bonding apparatus according to claim 6, wherein said second reflecting layer pattern formed on said photo-glass is formed so that an upper surface of said photo-glass is divided into first, second, third and fourth quadrants, the second reflecting layer of strips arranged on the first, second, third and fourth quadrants in the Y-axis direction, respectively, is formed by a predetermined pitch; and said second reflecting layers respectively formed on said first, second, third and fourth quadrants are staggered by a predetermined pitch with the Y-axis as a reference on said photo-glass.

9. A wire bonding apparatus according to claim 5, wherein said Y direction detecting portion comprises:

an encoding glass installed to the inductor of said X, Y table and having a predetermined third reflecting layer pattern for reflecting light;

a case, installed to said frame, incorporating a light source for irradiating light to said encoding glass and a light receiving portion for receiving light irradiated from said light source and reflected by said second reflecting layer pattern; and a photo-glass, installed on said case incorporating said light source and said light receiving portion, having a fourth reflection layer pattern for passing light reflected by said encoding glass through said light receiving portion or reflecting said light to said encoding glass.

10. A wire bonding apparatus according to claim 9, wherein said third reflecting layer pattern formed on said encoding glass is comprised of said third reflecting layer of strips arranged to have a predetermined pitch in the X direction on the encoding glass.

11. A wire bonding apparatus according to claim 9, wherein said fourth reflecting layer pattern formed on said photo-glass is formed so that an upper surface of said photo-glass is divided into first, second, third and fourth quadrants, fourth reflecting layers strips arranged on the first, second, third and fourth quadrants in the X-axis direction, respectively, is formed by a predetermined pitch; and said fourth reflecting layers respectively formed on said first, second, third and fourth quadrants are staggered by a predetermined pitch with the X-axis as a reference on said photo-glass.

12. A wire bonding apparatus according to claim 1, wherein said first transferring means further comprises a second location detecting means for detecting the transferred location of said second inductor.

13. A wire bonding apparatus, comprising:

a frame;

an X, Y table on said frame movable in X and Y directions;

a transducer having a capillary at one end thereof for supporting bonding wire;

first transferring means on said frame adjacent another end of said transducer opposite said one end for transferring said capillary;

second transferring means on said X, Y table and spaced from said first transferring means, for causing said one end of the transducer to transfer said capillary at the time of bonding; and a location detecting device adjacent said frame and said X, Y table for detecting the amount of movement of the X, Y table.

* * * * *